United States Patent
Sagara (10) Patent No.: US 7,225,540 B2
(45) Date of Patent: Jun. 5, 2007

(54) METHOD FOR MANUFACTURING AN INK JET HEAD

(75) Inventor: Tomoyuki Sagara, Sakurai (JP)

(73) Assignee: Sharp Kabushiki Kaisha, Osaka (JP)

( * ) Notice: Subject to any disclaimer, the term of this patent is extended or adjusted under 35 U.S.C. 154(b) by 351 days.

(21) Appl. No.: 10/499,891

(22) PCT Filed: Jan. 16, 2003

(86) PCT No.: PCT/JP03/00324

§ 371 (c)(1),
(2), (4) Date: Jun. 22, 2004

(87) PCT Pub. No.: WO03/061974

PCT Pub. Date: Jul. 31, 2003

(65) Prior Publication Data

US 2005/0068374 A1   Mar. 31, 2005

(30) Foreign Application Priority Data

Jan. 23, 2002 (JP) ............................. 2002-013923

(51) Int. Cl.
*B21D 53/76* (2006.01)
(52) U.S. Cl. .................. 29/890.1; 29/25.35; 29/847; 29/852; 347/68
(58) Field of Classification Search ............... 29/25.35, 29/890.1, 847, 852; 347/59, 60, 68–72; 310/313; 427/100
See application file for complete search history.

(56) References Cited

U.S. PATENT DOCUMENTS 5,193,256 A * 3/1993 Ochiai et al. ............. 29/25.35
5,625,393 A * 4/1997 Asai ............................. 347/69
5,933,169 A * 8/1999 Sugahara ...................... 347/71
6,070,310 A * 6/2000 Ito et al. .................. 623/17.11

FOREIGN PATENT DOCUMENTS

| JP | 04-307254 | 10/1992 |
|----|-----------|---------|
| JP | 6-218918  | 8/1994  |
| JP | 06-218918 | 8/1994  |
| JP | 9-094954  | 4/1997  |

* cited by examiner

Primary Examiner—A. Dexter Tugbang
Assistant Examiner—Tai Van Nguyen
(74) Attorney, Agent, or Firm—William J. Daley, Jr.; David G. Conin; Edwards Angell Palmer & Dodge LLP (57) ABSTRACT

The step of forming an electrode for external connection applies a conductive resin (10) to one end portion of each of a plurality of ink chambers (26) within each of the ink chambers (26) and to the top surface of each of a plurality of protrusions over a piezoelectric substrate (60) in one line perpendicular to the direction in which the ink chambers (26) extend. Subsequently, the conductive resin (10) located on the top surface of each of the plurality of ink chamber partitions is removed by polishing or grinding. As a result, the conductive resin (10) filling a space within each ink chamber (26) constitutes an electrode for external connection. This allows the capacitance due to the piezoelectric substrate to be decreased. Further, the driving frequency of the ink jet head can be increased. Thus, an ink jet head and its manufacturing method can be provided with a reduced power consumption, with an increased productivity and reliability and that allows a high speed printing.

8 Claims, 10 Drawing Sheets

METHOD FOR MANUFACTURING AN INK JET HEAD

This application is a National Stage Filing of PCT Application No. PCT/JP03/00324, filed Jan. 16, 2003, the teachings of which are incorporated herein by reference.

TECHNICAL FIELD

The present invention relates to an ink jet head for an ink jet printer and a method for manufacturing the same.

BACKGROUND ART

In a conventional ink jet head, an external extension electrode extends from an ink chamber electrode, which is provided within an ink chamber, to the outside of the ink chamber. The external extension electrode is connected to an external circuit. The ink chamber electrode is thus electrically connected with the external circuit.

Figure 14:
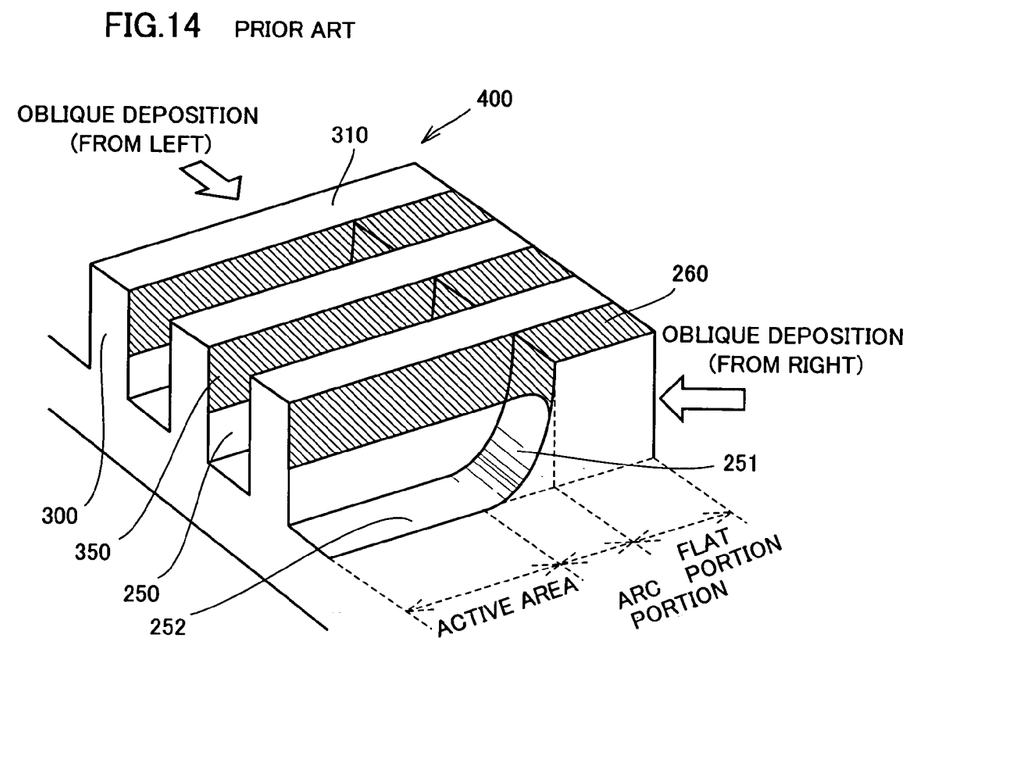
FIG. 14 is a perspective view of a piezoelectric substrate of a conventional ink jet head.

A method of providing an ink chamber electrode of a conventional ink jet head extending to the outside of the ink chamber is described below with reference to FIG. 14.

First, one of the main surfaces of a piezoelectric element that has been polarized in the direction of its depth is laminated with a dry film resist. The piezoelectric element is then halfway-diced using the dicing blade of a dicer. This forms an ink chamber 250 in the halfway-diced portion. Moreover, removal of the dicing blade from the halfway-diced piezoelectric element leaves an arc portion 251 at the rear end of the ink chamber. Halfway-dicing is further repeated for a plurality of times, producing a plurality of ink chambers 250 extending parallel to each other.

This provides an ink chamber array 400 having a plurality of ink chambers 250. Subsequently, a metal that is to be an electrode material, such as Al or Cu, is deposited in an oblique manner in a direction that is perpendicular to the direction in which the plurality of ink chambers 250 extend and that is oblique with respect to a main surface of ink chamber array 400. This operation is made in two oblique directions with respect to the direction of ink chambers 250. In this way, ink chamber electrodes, each formed of a metal film 350, are formed on a surface of ink chamber partition 300. At this stage, the dry film resist and ink chamber partitions 300 between ink chambers 250 exhibit a "masking effect". This provides a metal film 350 on an inner side of ink chamber 250 with a height of less than about half that of the inner side of ink chamber 250.

Metal film 350 is also formed in the portion of the rear end of ink chamber 250 with a curved surface (arc portion) 251 and in the portion of opening of the dry film resist in a flat portion 260. Subsequently, only the dry film resist on flat portion 310 atop each ink chamber partition 300 separating ink chambers 250 is removed, thereby establishing, in arc portion 251, an electrical connection between those metal films 350 that are opposed to each other within ink chamber 250.

Figure 15:
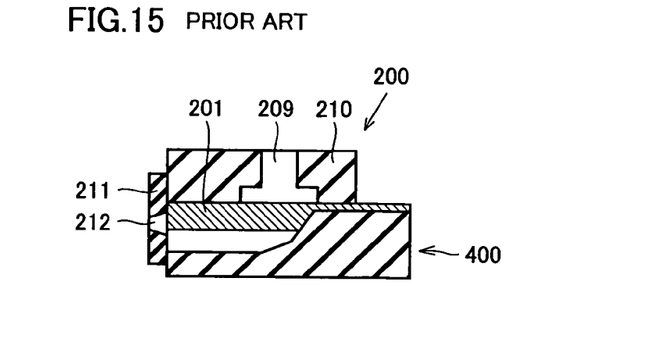
FIG. 15 is a cross sectional view of another conventional ink jet head.

Subsequently, as shown in FIG. 15, a cover 210 with an ink supply through hole 209 is bonded to ink chamber array 400. In addition, a nozzle plate 211 with nozzles 212 is bonded to ink chamber array 400. Thus, actuator 200 is obtained.

Actuator 200 provides for the Shear mode drive, where voltages in opposite phase are applied to the two respective ink chamber electrodes, each formed of one of opposing metal films 350 which is provided on the respective one of both inner sides of ink chamber partition 300 separating ink chambers 250. This causes ink chamber partition 300 to be bent angularly on the border between the region having the ink chamber electrode and the region without it, causing a change in the volume of ink chamber 250. This in turn causes a change in the pressure of ink within ink chamber 250. As a result, ink drops are ejected from very small nozzle 212 disposed at the tip end of ink chamber 250.

In the conventional structure of an ink jet head described above, active area 252 that contributes to the ejection of ink is only located between ink supply through hole 209 and the tip end. In other words, the region between ink supply through hole 209 and the rear end does not contribute to ink ejection. Further, metal film 350 in arc portion 251 and flat portion 260 electrically connects those two ink chamber electrodes that oppose each other in ink chamber 250. This provides an electrical connection between an electrode that is conductive with a driving IC 115 and metal film 350.

The above arrangement for ink jet heads suffers from the high material cost due to an excessively large portion that is not included in active area 252 which contributes to ink injection.

Moreover, the above ink jet head requires metal film 350 to extend from within ink chamber 250 to flat portion 260 on the piezoelectric substrate of lead zirconate titanate (PZT) having a high dielectric constant. This causes a large capacitance due to the piezoelectric substrate. This in turn disturbs the driving voltages applied to the actuator for driving it. Consequently, the frequency of the driving voltages must be reduced in the conventional ink jet head, which causes difficulty in driving and printing at a high speed.

Disturbance in the waveform of the applied driving voltages may be overcome by increasing the voltages applied to the actuator. Increasing the applied voltages, however, causes increase in the heat generated in driving the actuator to raise the temperature of the actuator itself. Thus, the conventional ink jet head suffers from a changing ink viscosity which makes a stable, precise printing impossible, an increased cost of the driving IC with high applied voltages, and the difficulty of reducing power consumption.

Accordingly, a conventional method of manufacturing ink jet heads preforms an Si—N film with a low dielectric constant between the piezoelectric substrate and the ink chamber electrode in the portion that is other than active area 252 of the ink chamber electrode within ink chamber 250 of the actuator. This achieves a negligible level of capacitance in the portion other than active area 250 using the conventional method. However, PZT has a low Curie point of about 200° C., requiring an electronic cyclotron resonance-chemical vapor deposition (ECR-CVD) device, which is very expensive, in order to form an Si—N film with a low dielectric constant on PZT using a process with a low temperature. As a result, the manufacturing cost is increased in the conventional method such that inexpensive ink jet heads cannot be produced.

Figure 16:
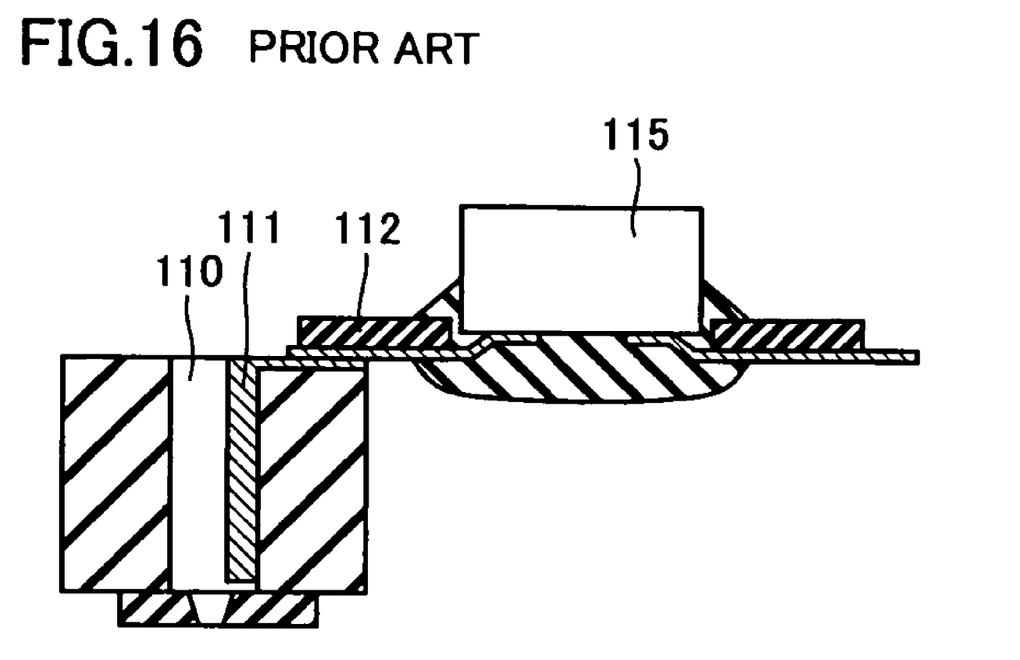
FIG. 16 is a cross sectional view of yet another conventional ink jet head.

A technique for coping with the above problems is disclosed in Japanese Patent Laying-Open No. 9-94954, which provides an ink jet head where, as shown in FIG. 16, the portion other than active area 252 is not located on an extension line of the ink chamber in the piezoelectric substrate.

In the described technique, an ink supply through hole 110 is provided at the rear end of the active area of the piezoelectric substrate to supply ink. Each electrode 111 in the ink chamber extends externally on the ink supply side of the substrate or extends to the area of the ink ejection side of the substrate on its inner surface. This provides an electrical connection of electrode 111 in the ink chamber with electrode 112 which is conductive with a driving IC 115. In this case, no portion other than the active area for the actuator is provided on the piezoelectric substrate, decreasing the material cost for the piezoelectric substrate. However, an electrode 111 in the ink chamber extending externally on the ink supply side of the substrate or extending to the area of the ink ejection side of the substrate on its inner surface still suffers from the problem that the capacitance due to the piezoelectric substrate in the extending portion of ink chamber electrode 111 cannot be reduced.

Moreover, in the above method, electrode 111 in the ink chamber extends to be bent at 90° at a corner of the piezoelectric substrate forming the actuator.

The extension of an electrode to a side of an actuator requires a metal film to be provided on the side of the actuator such that the piezoelectric substrate is divided into small individual actuators and an extension electrode is then put into continuity with the respective pair of ink chamber electrodes. Further, a separation of the extending electrodes requires the steps of forming a uniform layer of conductor with a resist pre-patterning and then separating it into electrodes by dicing or using yttrium aluminum garnet (YAG) laser. Consequently, the process is extremely complicated and thus productivity is low, reducing the yield and increasing the production cost. Moreover, it is highly possible that an extending electrode is broken up at a bended portion of the electrode which extends from within the ink chamber to a side of the actuator, during subsequent steps or transportation of the actuator, thereby decreasing the yield and the reliability in terms of the environment.

The extension electrodes may also be formed using plating. However, the plating technique requires, similar to deposition techniques, the steps of patterning or dividing a material into electrodes. This may complicate the process.

Also, the above extension electrode as in FIG. 16 can be broken up at a bended portion of the electrode extending from within the ink chamber to a surface of the actuator because of a botched handling during subsequent steps. Consequently, the conventional ink jet head has the problems of decreased yield and less reliability in terms of the environment.

DISCLOSURE OF THE INVENTION

An object of the present invention is to provide an ink jet head with reduced power consumption, improved productivity and reliability, capable of a high speed printing, and a method of producing the same.

An ink jet head of the present invention includes an ink chamber extending on the surface of a piezoelectric substrate from one to the other end, and driving electrodes provided within the ink chamber. The ink jet head further includes an electrode for external connection that is connected to the driving electrodes and is also connected to an external electrode provided externally. Further, the electrode for external connection of the ink jet is composed of a conductive material filling an end portion of the ink chamber.

In a conventional ink jet head, the electrode for external connection extends from within the ink chamber and along the surface of the piezoelectric substrate exterior to the ink chamber when the ink chamber electrode is mounted in the ink chamber. This is not necessary for the above structure of an ink jet head.

Further, according to the above ink jet head, almost no portion is required other than the active area of the piezoelectric substrate forming the actuator. This can reduce the material cost of the piezoelectric substrate.

Also, according to the above structure of an ink jet head, the electrode for external connection does not need to extend from within the ink chamber and along the surface of the piezoelectric substrate exterior to the ink chamber. This suppresses the increase in the capacitance due to the extending portion of the electrode for external connection, whereby the driving frequency can be improved. Thus, a high-speed printing is allowed.

Moreover, the driving voltages of the actuator do not need to be increased to achieve a high-speed printing. Consequently, it is possible to reduce the withstand voltages of the driving IC. Thus, according to the above ink jet head, the cost of the driving IC and the power consumption for driving the driving IC can be reduced.

In the present ink jet head, the conductive material includes a conductive resin.

According to the above arrangement, a dispenser can be used in manufacturing to apply a conductive resin. This facilitates the manufacture of the conductive material. In addition, warping of the piezoelectric substrate can be minimized by mixing a conductive filler with a low extension material to reduce the coefficient of thermal expansion of the conductive resin.

The conductive resin of the present ink jet head includes one or more conductive filler(s) selected from the group consisting of Au, Ag, Ni, Cu, C, and solder.

According to the above arrangement, using Au or Ag for the conductive material can minimize the electrical resistance of the conductive resin and that between the conductive resin and the electrode that is conductive with the driving IC. This results in a possible improvement in the driving frequency of the voltages applied for driving the actuator. Thus, the above structure of an ink jet head provides a high-speed printing.

Alternatively, using Ni, Cu or C for the conductive material can minimize the cost of the conductive resin. Although this might cause a difficulty in achieving high-speed printing, it provides an extremely economic actuator. In the case of solder, when establishing an electrical connection to an external circuit, a solder filler is molten to allow a metal diffused junction, thereby establishing a connection with the external circuit electrode. Thus, a connection can be established with a high reliability and having a smaller value of connection resistance.

In the present ink jet head, each piece of the conductive filler has a longitudinal size ranging from 0.1 to 30 µm.

According to the above structure, pieces of conductive filler of the conductive resin have a relatively large contact area and are sufficiently large to serve as conductive resin; Thus, the electrical conductivity of the conductive resin can be improved without causing problems.

In the present ink jet head, an electrode for external connection is formed by polishing or grinding the entire area of the top surface of the protruding wall defining the ink chamber.

Generally, after the conductive material deposited on the top of each ink partition is polished or grinded, the polishing rate becomes extremely small when the polishing or grinding member abuts against the top surface of the partition. The above arrangement can take advantage of this to allow a reliable management of the position in which the polishing should end.

In the present ink jet head, the electrode for external connection may be formed by selectively polishing or grinding the top surface of each protrusion.

According to the above arrangement, there is no need to level warping that has occurred in the piezoelectric substrate as is the case that the entire surface of a piezoelectric substrate is treated. Thus, the piezoelectric substrate only needs to be fixed on the dicing stage by vacuum absorption as in the normal dicing. This can simplify the process significantly.

In the present ink jet head, the selective polishing or grinding is performed in the direction parallel to the direction in which the ink chambers extend.

According to the above arrangement, no force is generated that pulls apart the conductive material that is to be an electrode for external connection from a driving electrode. This improves the yield of the ink jet head.

In the present ink jet head, the selective polishing or grinding may be performed in the direction perpendicular to the direction in which the plurality of ink chambers extend.

The above arrangement facilitates the selective polishing or grinding.

A method of manufacturing the present ink jet head includes the step of forming an ink chamber extending on a surface of a piezoelectric substrate from one to the other end, and the step of forming driving electrodes within the ink chamber. The method further includes the step of forming an electrode for external connection connected to the driving electrodes and to an external electrode provided externally. The step of forming the electrode for external connection mentioned above further includes the step of applying a conductive material to one end of the ink chamber within the ink chamber and on the top surface of each protruding wall defining the ink chamber, and the step of removing the conductive material applied to the top surface of each protrusion on the piezoelectric substrate.

According to the above method, the conductive material applied to the ink chamber can integrate a plurality of electrodes within the ink chamber into one. At the same time, the cut surface of the applied conductive material divided into small pieces or the exposed portion forming the surface of the applied conductive material provides for connection with the external circuit. As a result, there is no need to form an actuator with a complicated structure. A simpler process is thus achieved.

Further, according to the above method, a dispenser may be used to apply the conductive material. The above method also allows, when using a conductive filler and a low expansion material mixed together, the coefficient of thermal expansion of the conductive material to be reduced, thereby minimizing warping of the piezoelectric substrate.

In the present method, the step of removing the conductive material includes the step of removing the conductive material applied on the top surface of each protrusion on the piezoelectric substrate using polishing or grinding.

According to the above method, conventional equipment and tools may be used to remove conductive material without difficulties.

In the present method, the polishing or grinding may be performed on the entire of the top surface of each protrusion.

According to the above method, polishing or grinding rates for the conductive material are different from those for the piezoelectric substrate. Accordingly, the time to terminate the polishing or grinding process can be readily identified taking advantage of the significant change in the polishing or grinding rate.

In the present method, the polishing or grinding may include selectively polishing or grinding the portion of the top surface of each protrusion where the conductive material is provided.

According to the above method, there is no need to level warping that has occurred in the piezoelectric substrate as is the case that the entire top surface of each protrusion over the piezoelectric substrate is treated. Therefore, the piezoelectric substrate can be just fixed to the dicing stage by vacuum absorption without any disadvantages. This results in a simpler manufacturing process.

In the present method, the selective polishing or grinding is performed in the direction parallel to the direction in which the ink chambers extend.

According to the above method, no stress is applied in the direction that causes the conductive material that is to be an electrode for external connection to be pulled apart from the wall defining the ink chamber. Thus, the reliability of the continuity can be improved between the conductive material and the ink chamber electrode.

In the present method, the selective polishing or grinding may be performed in the direction perpendicular to that of the ink chambers. Such a method simplifies the polishing or grinding.

In the present method, the step of removing the conductive material includes the step of removing the conductive material by grinding using a dicing or slicing machine.

According to the above method, the inventive grinding can be realized by only replacing blades. As a result, no additional investment is required in equipment.

In the present method, the grinding using the dicing or slicing machine may include chopping. Such a chopping process is advantageous in that the grinding process is simplified.

In the present method, in the case of having a plurality of ink chambers that extend parallel to each other, the step of applying the conductive material may desirably include applying a conductive resin linearly crossing the plurality of ink chambers perpendicularly. Such a method facilitates application of the conductive resin.

BEST MODES FOR CARRYING OUT THE INVENTION

Now, an ink jet head and a method of manufacturing it according to the embodiments of the present invention will be described with reference to the accompanying drawings.

(First Embodiment)

An ink jet head according to a first embodiment is described below referring to FIGS. 1–3.

Figure 1:
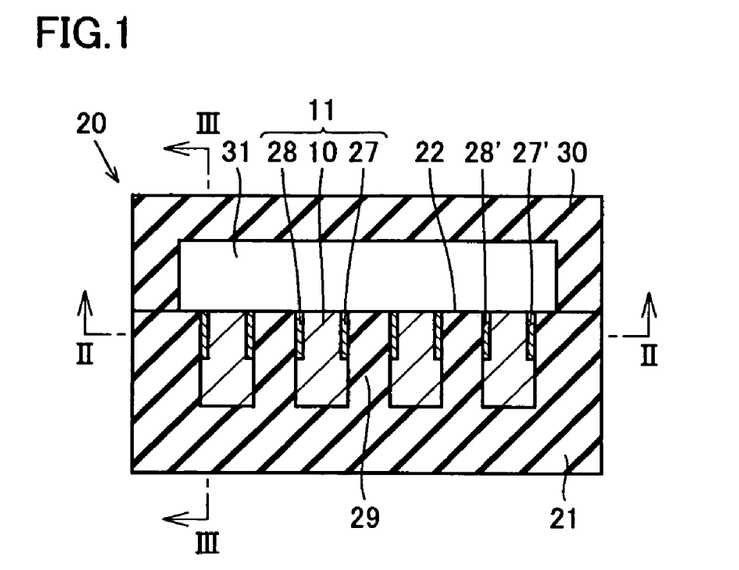
FIG. 1 illustrates an ink jet head of a first embodiment.
Figure 2:
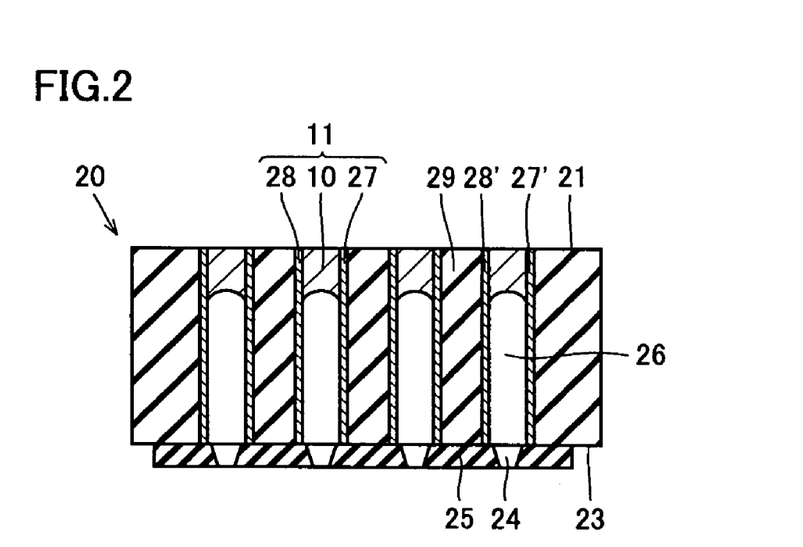
FIG. 2 is a cross sectional view taken along line II—II of FIG. 1.
Figure 3:
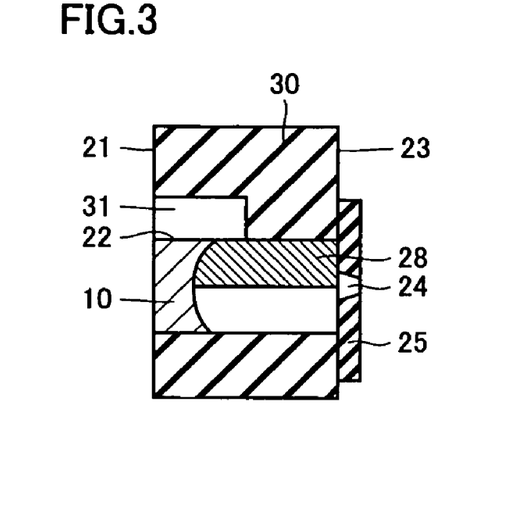
FIG. 3 is a cross sectional view taken along line III—III of FIG. 1.

The ink jet head of the present embodiment, as shown in FIGS. 1 and 2, has a conductive resin 10 containing an Ag conductive filler filling a space between actuator driving electrodes 27 and 28 and close to rear end surface 21 of actuator 20 formed of a lead zirconate titanate (PZT) piezoelectric element.

In the area of rear end surface 21 of actuator 20, a cutaway end of conductive resin 10 is exposed. Also, as shown in FIG. 2 showing a cross section taken along line II—II of FIG. 1 and in FIG. 3 showing a cross section taken along line III—III of FIG. 1, conductive resin 10 is also exposed in the area of top end surface 22 of that portion of ink chamber 26 that is filled with conductive resin 10.

In each ink chamber 26, two actuator driving electrodes 27 and 28 are provided, facing each other within ink chamber 26. Two electrodes 27 and 28 are electrically connected via conductive resin 10 placed therebetween.

A nozzle plate 25, having a very small nozzle 24, is attached to ink ejection surface 23 of actuator 20. A cover 30 is provided that defines an ink supply through hole 31 at the rear of top end surface 22 of actuator 20.

A plurality of ink chambers 26, disposed in an array, are separated by ink chamber partition(s) 29 provided by the piezoelectric element. Actuator driving electrodes 27 and 28, each disposed on its respective ink partition 29 and closer to top end surface 22, as well as conductive resin 10 are integrated into one conductive resin electrode 11. When a voltage is applied to conductive resin electrode 11, actuator driving electrodes 27 and 28 are at the same potential with conductive resin 10.

Voltages of opposite phase are applied to actuator driving electrodes 27, 28 and actuator driving electrodes 27', 28' opposite to them on the other side of ink chamber partition 29, in order to drive ink chamber partition 29 using the Shear mode. The pressure of ink within ink chamber 26 is thus controlled to eject ink droplets through nozzle 24.

Figure 4:
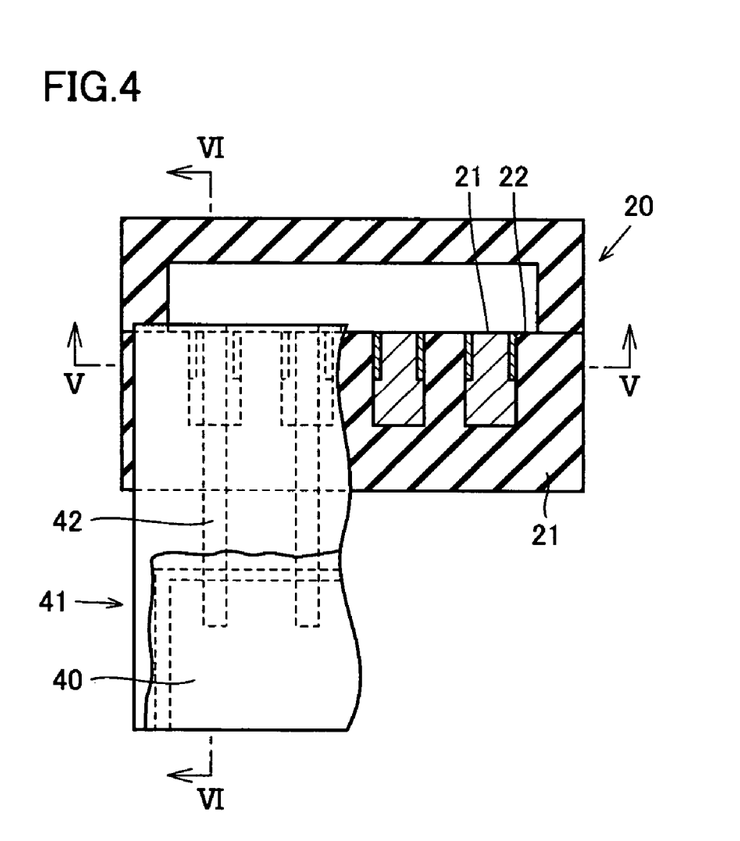
FIG. 4 is a cross sectional view of the ink jet head of the first embodiment connected to a driving IC.
Figure 5:
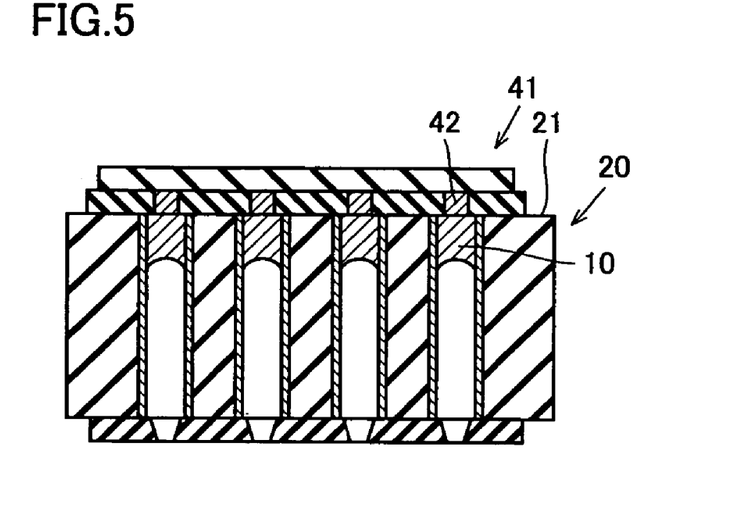
FIG. 5 is a cross sectional view taken along line V—V of FIG. 4.
Figure 6:
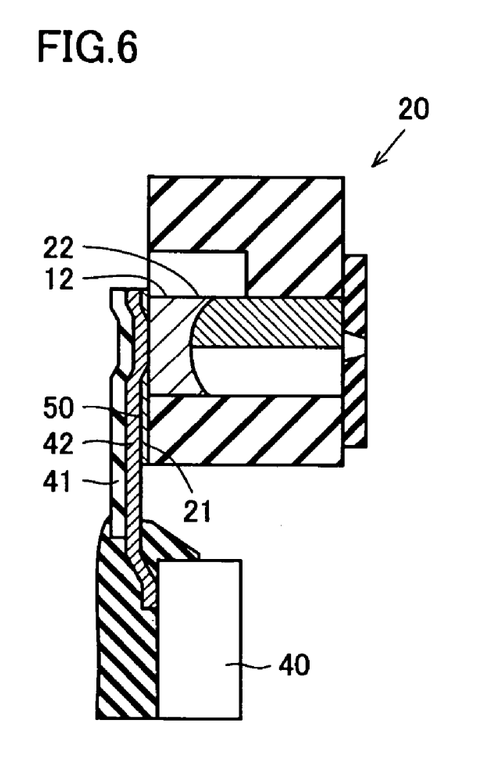
FIG. 6 is a cross sectional view taken along line VI—VI of FIG. 4.

Further, in the ink jet head of the present embodiment, an exposed surface of conductive resin 10 in the area of top end surface 22 of actuator 20 is electrically connected to an external electrical circuit through anisotropic conductive film (ACF) 50, as shown in FIGS. 4–6, using an outer lead 42 on a tape automated bonding (TAB) tape 41, which is conductive with driving integrated circuit (IC) 40.

An exposed surface of conductive resin 10 in the area of rear end surface 21 of ink chamber 26 may also be electrically connected to an external electrical circuit. Conductive resin 10 may be formed from an Au plated bump, Au transferred bump or Au wall bump on outer lead 42. This bump conductive resin 10 may be pierced with outer lead 42 to electrically connect conductive resin 10 with an external circuit. This provides a more stable electrical connection, since outer lead 42 and conductive resin 10 have a greater contact area.

For an electrical connection path, the ink jet head of the present embodiment uses a path through outer lead 42, conductive resin 10 and actuator driving electrodes 27, 28.

It is also possible to connect a protrusion electrode provided on driving IC 40 directly with conductive resin 10 of the actuator. In this case, conductive resin 10 may be pierced with the protrusion electrode. This connection mode mounts a bare chip directly on the actuator, producing a smaller and more lightweight ink jet head. The above connection mode also allows heat generated by the driving of driving IC 40 to be conducted to the ink, thereby cooling driving IC 40.

Figure 7:
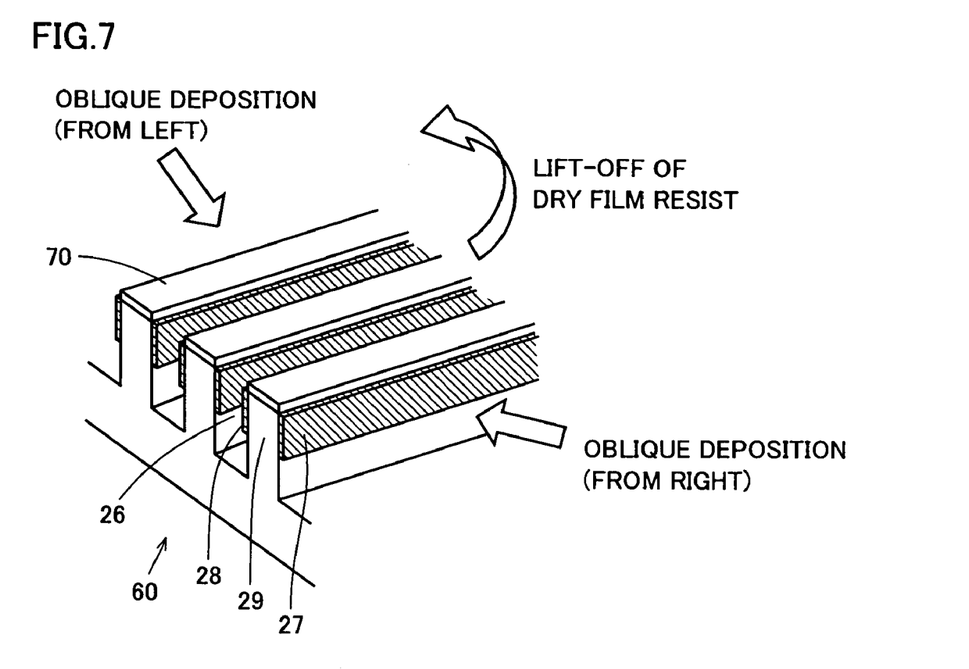
FIG. 7 is a perspective view of an ink jet head illustrating a method of manufacturing the ink jet head according to the first embodiment.

Next, a method of manufacturing the ink jet head described above will be illustrated with reference to FIGS. 7 to 10. First, as shown in FIG. 7, one surface of piezoelectric substrate 60 that has been polarized in the direction of its depths is laminated with a dry film resist 70.

A dicing blade of a dicer is then used to halfway-dice the piezoelectric wafer to form ink chamber 26. The width of the dicing blade corresponds to that of ink chamber 26.

After the ink chamber array is thus formed, a metal that is to be an electrode material, such as Al and/or Cu, is deposited in an oblique manner in a direction that is perpendicular to the direction in which ink chambers 26 extend and that is oblique with respect to a main surface of the ink chamber array.

This forms a metal film on each of both inner sides of ink chamber partition 29. At this time, the films of dry film resist and ink chamber partitions 29 exhibit the masking effect. Metal films are thus formed, each with a height of about half the height of ink chamber 26, measured in the direction of the height of the chamber. The metal films form actuator driving electrodes 27 and 28.

Subsequently, the films of dry film resist are lifted off. Accordingly, no metal film for an electrode material described above remains atop ink chamber partition 29 of ink chamber 26. This ensures that ink chambers 26 are electrically separated from each other.

Figure 8:
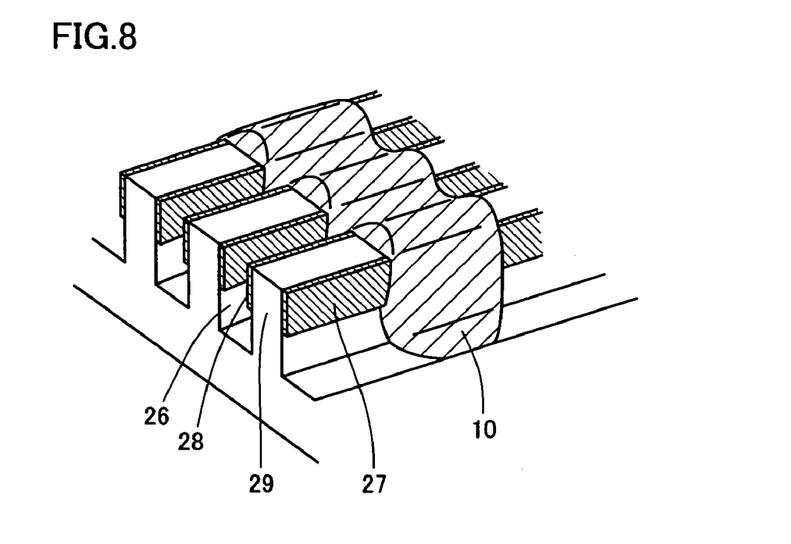
FIG. 8 is a perspective view of an ink jet head illustrating a method of manufacturing the ink jet head according to the first embodiment.

Next, as shown in FIG. 8, a dispenser or the like is placed in the direction perpendicular to the main surface of piezoelectric substrate 60. In this way, conductive resin 10 is applied, 0.5 mm in width, to the inner surfaces of ink chamber 26 and the top face of ink chamber partition 29 linearly traversing ink chambers 26 and ink chamber partition 29.

Conductive resin 10 thus flows into ink chambers 26. Thus, actuator driving electrodes 27 and 28 facing each other and each disposed on the upper portion of an ink chamber partition 29 are electrically connected with each other. Since conductive resin 10 is also applied on the top face of ink chamber partition 29, all actuator driving electrodes 27, 28 are electrically connected.

Generally, conductive resin 10 is provided by mixing a conductive filler and an adhesive. Pieces of conductive filler are provided contiguously between actuator driving electrodes 27 and 28.

To ensure that conductive resin 10 that has flown in ink chamber 26 electrically connects those actuator driving electrodes 27 and 28 located on the inner sides of an ink chamber partition 29, a large number of pieces of conductive filler are required to be in connection. It is desirable, therefore, that each piece of conductive filler for conductive resin 10 has a longitudinal size of 0.1 μm–30 μm.

The electrical resistance between the pieces of conductive filler is expected to vary depending on the properties of the conductive filler, the diameter of each piece of conductive filler, the adhesive viscosity of the conductive filler, the width of ink chamber 26, the width of the applied conductive filler, and the contiguousness of the pieces of conductive filler. Therefore, a centrifugal force is applied to piezoelectric substrate 60 to which conductive resin 10 has been applied to ensure that the pieces of conductive filler are contiguous. In this way, more conductive filler can flow in ink chamber 26. As a result, electrical connection between conductive resin 10 and actuator driving electrodes 27, 28 are more reliable.

The applied conductive resin 10 is then heated and cured. The heating conditions depend on conductive resin 10. In the ink jet head of the present embodiment, the heating is desirably performed at a temperature equal to or less than the Curie point of piezoelectric substrate 60 to prevent elimination of the polarization properties of polarized piezoelectric substrate 60 due to the heating.

Generally, conductive resin 10 has a coefficient of thermal expansion greater than that of piezoelectric substrate 60. Consequently, after conductive resin 10 is applied to ink chamber 26 and then cured, piezoelectric substrate 60 is warped to take a concave shape as viewed in a cross section perpendicular to the direction of the grooves of ink chambers 26. When a force is applied in subsequent steps to conductive resin 10 in a direction that enables the warping to be leveled, conductive resin 10 may be pulled apart from actuator driving electrodes 27, 28. As a result, conductive resin 10 may be electrically disconnected with actuator driving electrodes 27, 28.

Accordingly, conductive resin 10 preferably has a coefficient of thermal expansion close to that of piezoelectric substrate 60. Conductive resin 10 has a conductive filler mixed together with a material that has a coefficient of thermal expansion smaller than that of piezoelectric substrate 60. Thus, the coefficient of thermal expansion of conductive resin 10 is desirably reduced such that the coefficient of thermal expansion of conductive resin 10 as a whole is closer to that of piezoelectric substrate 60.

Figure 9:
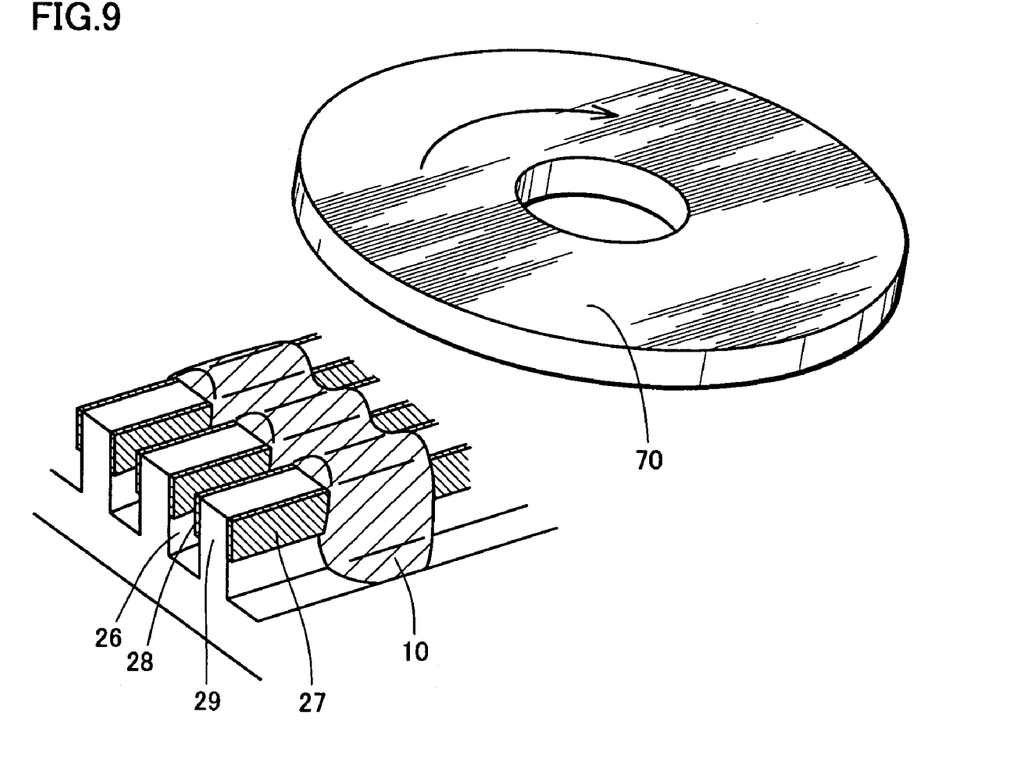
FIG. 9 is a perspective view of an ink jet head illustrating a method of manufacturing the ink jet head according to the first embodiment.

Next, as shown in FIG. 9, conductive resin 10 which has been applied to the top of ink chamber partition 29 is removed by polishing using a polishing member 70. This allows members that each form an ink chamber electrode to be electrically separated. The polishing disk is positioned with respect to an actuator wafer in such a way that a portion of the polishing disk that comes in contact with the top surface (upper surface) of ink chamber 29 moves in a direction parallel to that of ink chambers 26. This can suppress the delamination of actuator driving electrodes 27, 28 from ink chamber partition 29.

The polishing is performed in the steps of: leveling the warping that has occurred in piezoelectric substrate 60; adhering the back surface of the leveled piezoelectric substrate 60 onto a highly flat plate using wax; and polishing or grinding the top face of piezoelectric substrate 60 using a wrapping surface plate or a cup abrasive. This removes conductive resin 10 which has been applied to the top of ink chamber partition 29. This results in a structure shown in FIG. 10.

Figure 10:
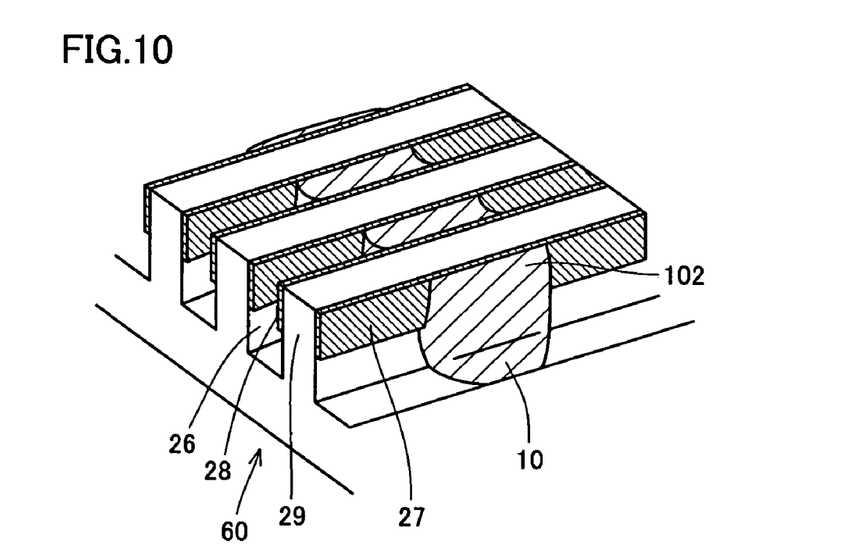
FIG. 10 is a perspective view of an ink jet head illustrating a method of manufacturing the ink jet head according to the first embodiment.

The area of conductive resin 10 applied to the top of ink chamber partition 29 is smaller than that of the main surface of piezoelectric substrate 60. Consequently, when the polishing is finished (that is, electrical separation between ink chamber electrodes is completed), the area for polishing increases dramatically. This causes the polishing rate to be significantly decreased. Thus, the position for finishing the polishing can be managed by monitoring variations in the polishing rate.

The roughness of the polished surface is determined to provide for an adhesion of a cover wafer 61, as described below. Consequently, in the method of the present embodiment, the polishing uses an abrasive of approximately No. 4000. The above steps allow each conductive resin 10 in its respective ink chamber 26 to be electrically separated from another.

In the method of the present embodiment, the polishing allows each conductive resin 10 in its respective ink chamber 26 to be electrically separated from another. Accordingly, the deposition of the electrode material to ink chamber partition 29 to form films can be performed without using dry film resist 70. Thus, actuator driving electrodes 27 and 28 may also be formed atop ink chamber partition 29.

Figure 11:
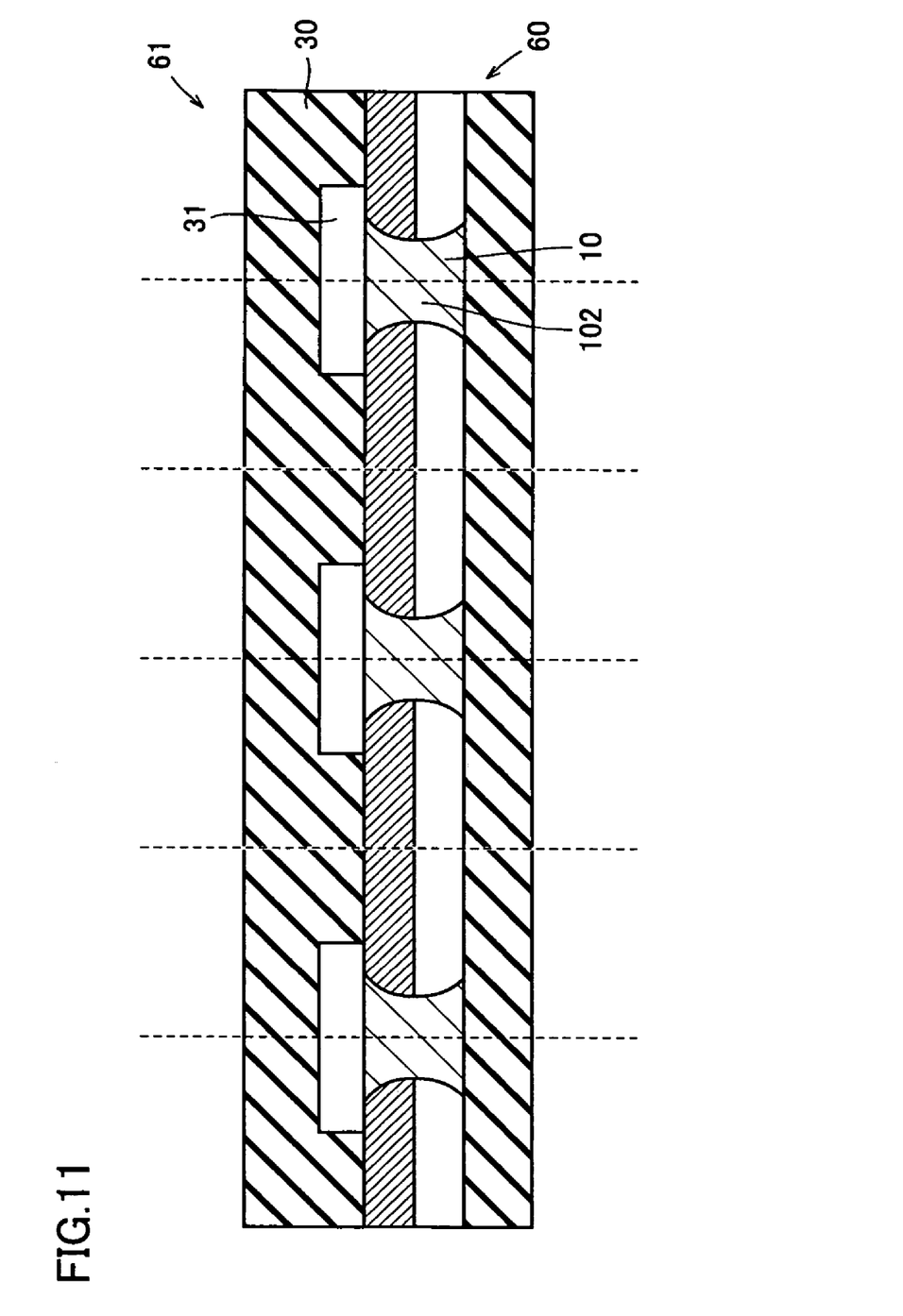
FIG. 11 is a cross sectional view of the ink jet head illustrating the method of the first embodiment.

A cover wafer 61 as shown in FIG. 11 is prepared that is composed of a piezoelectric element with bores that are to be ink supply through holes 31. Cover wafer 61 defines voids that serve as ink supply through holes 31 after the subsequent steps to finish the ink jet head, and are to be cover members 30 sealing ink chambers 26 at the top.

Normally, cover wafer 61 is desirably made of the same material as that of the piezoelectric element defining ink chamber 26 in order to better match it with the actuator defining ink chambers 26 in terms of the coefficient of thermal expansion. However, cover wafer 61 may be formed of any material that has a coefficient of thermal expansion relatively close to that of the piezoelectric element defining ink chambers 26, for example alumina ceramic.

Piezoelectric substrate 60 for the ink chamber array is then adhered to cover wafer 61 using a commercially available adhesive. At this point, each buried conductive resin 10 is positioned to be located at the center of the respective bore for ink supply through hole 31 in cover wafer 61. Piezoelectric substrate 60 is then bonded to cover wafer 61.

Fully-dicing is subsequently performed, using a dicing blade of a dicer, along the dicing lines indicated by broken lines in FIG. 11, in the area of each of the ink supply through hole bores in cover wafer 61, in other words, in the area of each buried pressurized member 102 forming a protrusion formed of conductive resin 10 in piezoelectric substrate 60. Piezoelectric substrate 60 and cover wafer 61 are thus divided into individual actuators.

At this stage, in the cut surface produced by the dicer, the cut surface of each conductive resin 10 is exposed as a side of the actuator. This provides an electrode for external connection connected to an external circuit that is, in turn, connected to the driving IC. This results in a finished actuator.

Instead of conductive resin 10, a solder may fill a space between actuator driving electrodes 27 and 28 in the method of the present embodiment. Solder has better physical properties than a conductive resin in terms of connection between the external circuit and actuator driving electrodes 27 and 28, and have a better electrical conductivity. This provides a more reliable connection between the external circuit and actuator driving electrodes 27, 28, while reducing variations in the electrical resistance among ink chambers.

To form a solder electrode (not shown) in an ink chamber 26, solder paste provided by mixing a flux and solder particles is supplied into ink chamber 26 using a dispenser or the like. Then, a laser beam is directed to partially heat the solder, whereby solder is molten in the ink chamber. As a result, the cut surface of the solder resulting from the dicing forms a contact surface between the solder electrode and the external electrode.

During the step of filling a space in ink chamber 26 with solder, a forced cooling is performed on the active area if necessary. This can prevent depolarization caused by the applied heat at the active area.

In the structure of the ink jet head of the present embodiment as described above, the electrode for external connection is composed of a conductive resin filling a space within the ink chamber and a pressurized member or a solder and pressurized member. Consequently, according to the ink jet head of the present embodiment, there is no need for an extension electrode extending from the ink chamber electrode to the outside. In addition, almost no portion other than the active area of the actuator is necessary. Thus, the material cost can be reduced.

Moreover, in the ink jet head of the present embodiment, the electrode for external connection does not have a portion extending along the surface of the piezoelectric element. This can minimize the increase in capacitance due to a long electrode portion extending on the surface of the piezoelectric element. This can improve the driving frequency of the actuator. As a result, high-speed printing can be achieved. Further, according to the ink jet head of the present embodiment, high voltages are not required to be applied to improve the driving frequency. This can reduce the driving voltages for the driving IC. As a result, the power consumption for the driving can be reduced.

In a conventional ink jet head, two or more independent electrodes opposite to each other within an ink chamber in an actuator for Shear mode driving need to be integrated into one driving circuit. This results in an actuator with a large size and a complicated structure. As a result, in a conventional ink jet head, a plurality of electrodes within an ink chamber need to be integrated into one for each ink chamber, while an extension electrode connected to the electrode within the ink chamber need to extend to a flat region on the actuator.

However, according to the method of the present embodiment, a conductive resin or solder filling a space in the ink chamber may be used to integrate a plurality of electrodes that were located outside the ink chamber into one. Also, in the actuator of the present embodiment, the filling conductive resin, the cut surface of a solder or the surface of the filling solder is connected with the external circuit. Thus, an actuator with a complicated structure is not necessary. In this way, a simpler manufacturing process for an actuator can be achieved.

The electrode for external connection of a conductive resin is composed of Au, Ag, Ni, Cu, C or solder as conductive filler material of the conductive resin. Consequently, using Au or Ag for the conductive filler material of the conductive material can reduce the electrical resistance in the conductive resin and the resistance in the connection to the electrode conductive with the driving IC. As a result, the waveform of applied voltages for driving the actuator is not disturbed and the driving frequency can be increased. In this way, high-speed printing can be achieved. Alternatively, using Ni or Cu for the conductive filler material of the conductive resin can reduce the cost of the conductive resin. Although this may cause difficulty in printing at a high speed, it can provide a highly inexpensive actuator.

When a solder is used for the conductive filler material of the conductive resin, during establishing an electrical connection of the electrode for external connection with an external circuit, a solder filler is molten to allow a metal diffused junction, thereby establishing a connection with the external circuit electrode. Accordingly, connection between the ink chamber electrodes can be established with a small value of connection resistance, while establishing a more reliable connection between ink chamber electrodes.

Further, when the ink chamber electrode is formed of Al, an oxide film is formed on the surface of each ink chamber electrode made of Al. Accordingly, it is desirable to use a conductive filler with its pieces having a structure with an acute angle such as a needle, a flake or a spiked ball. Using a conductive filler having a structure with an acute angle causes the oxide film to be partially destroyed during the step of filling with the conductive resin, in regions where the conductive filler abuts against the ink chamber electrode of Al. This results in a decrease in connection resistance between the conductive resin and the ink chamber electrode. Accordingly, the driving frequency of applied voltages can be increased without disturbing the waveform of applied voltages for driving the actuator. As a result, a high-speed printing can be achieved.

In the electrode for external connection made of a conductive resin, the conductive filler is placed most densely within the conductive resin when using a conductive filler for the conductive resin with an approximately round shape. The amount of the exposed conductive filler per unit area on a cut surface of the conductive resin is thus at its maximum, reducing the value of connection resistance in the electrical connection between the electrode for external connection and the external circuit. As a result, the driving frequency can be increased without disturbing the waveform of applied voltages for driving the actuator, achieving a high-speed printing.

The electrode for external connection is desirably made of a conductive resin having a glass transition point of 60° C. or more. In this case, sufficient reliability can be achieved at the storage and service temperatures for the ink jet head.

The electrode for external connection may be connected to the external circuit using an Sn based solder, which is a most readily available and inexpensive solder material, such that an ink jet head can be readily provided at low cost.

According to the ink jet head of the present embodiment using a solder for an electrode for external connection, the number of added elements and their amount can be easily reduced at the solder manufacturer. Further, the ink jet head of the present embodiment facilitates the control of the melting point of the solder by, for example, increasing the melting point of the solder depending on a temperature during the mounting process of the external circuit. Thus, a novel actuator can be quickly developed and can be changed in its specification without difficulties. In addition, when the electrode for external connection is composed of a solder material with a melting point of 80° C. or higher, a sufficient reliability can be accomplished at the storage and service temperatures for the ink jet head.

(Second Embodiment)

A method of manufacturing an ink jet head according to a second embodiment of the present invention is described below with reference to FIG. 12.

The method for manufacturing the ink jet head of the present embodiment is different from that of the first embodiment in the manner in which conductive resin 10 which has been applied to the top of ink chamber partition 29 is removed. In the method of the first embodiment, a conductive resin cell applied to the top of each ink chamber partition 29 is removed by polishing or grinding the entire top surface of each ink chamber partition 29 over piezoelectric substrate 60. On the contrary, in the method of the present embodiment, conductive resin 10 is removed by selectively polishing or grinding the region of each ink chamber partition 29 where conductive resin 10 is applied.

In the method of the present embodiment, similar to that of the first embodiment, conductive resin 10 is applied to ink chamber 26 and ink chamber partition 29 in one line with a width of 0.5 mm using a dispenser or the like in the direction perpendicular to that of ink chambers 26 of piezoelectric substrate 60, as shown in FIG. 8. Conductive resin 10 is subsequently cured. Next, as shown in FIG. 12, conductive resin 10 which has been applied to the top of ink chamber partition 29 is selectively removed by moving a blade (abrasive) of a dicing or slicing machine in the direction in which conductive resin 10 was applied.

After conductive resin 10 which is located on the top surface of each ink chamber partition 29 has been removed, grinding is performed using a blade in the direction of the line in which conductive resin 10 was applied, to cut ink chamber partition 29 in the depth of 10–20 µm. This allows ink chambers 26 to be electrically separated.

The blade width Wb is greater than the width W of applied conductive resin 10, and may be 1.0 mm. As a result of the blade machining, the portion of ink chamber partition 29 where conductive resin 10 is applied has a height that is smaller than that of the other portion of ink chamber partition 29 by 10 –20 µm. Consequently, the grinded portion of the partition, with a width of 1.0 mm, does not contribute to adhesion with cover wafer 61. Thus, the surface roughness of the grinded portion having a width of 1.0 mm does not need to be taken into account, such that the blade can be selected solely based on its ability in machining during the removal of conductive resin 10.

In the method of the present embodiment, the blade used for machining includes a diamond blade of No. 600. Thus, satisfactory grinding can be achieved without conductive resin 10 clogging the blade.

In the method of the present embodiment, not the entire top face of each ink chamber partition 29 over piezoelectric substrate 60 is polished or grinded. Instead, only the portion of conductive resin 10 applied to the top of ink chamber partition 29 is selectively polished or grinded to be made flat. Accordingly, unlike the method of the first embodiment where the entire top face of each ink chamber partition 29 over piezoelectric substrate 60 is polished, there is no need to level warping of piezoelectric substrate 60. In addition, according to the ink jet head of the present embodiment, piezoelectric substrate 60 may be fixed to the dicing stage by vacuum absorption as in a usual dicing without any disadvantages.

Further, in the method of the present embodiment, the dicing or slicing machine for forming ink chamber 26 is employed. Consequently, the inventive grinding can be realized just by replacing blades, eliminating need for investment in new equipment.

(Third Embodiment)

A method of manufacturing an ink jet head according to a third embodiment of the present invention is described below with reference to FIG. 13. The method of the present embodiment is different from those of the first and second embodiments in its way of removing conductive resin 10. In the method of the second embodiment, ink chamber partition 29 is cut with a depth of 10–20 µm using a blade to perform the grinding in the direction of the line in which the resin was applied to ink chamber partitions 29 by a dispenser.

In the method of the present embodiment, conductive resin 10 is removed by selectively polishing or grinding the portion of conductive resin 10 atop ink chamber partition 29 by chopping, in the direction perpendicular to the conductive resin cells applied to ink chamber partitions 29 in one line by a dispenser (i.e. in the direction in which ink chambers 26 extend).

In the method of the present embodiment, similar to that of the first embodiment, conductive resin 10 is first applied to ink chamber 29 and ink chamber partition 29 in one line with a width of 1.0 mm, using a dispenser or the like, in the direction perpendicular to the array of ink chambers 26 on piezoelectric substrate 60, as shown in FIG. 8. Conductive resin 10 is subsequently cured. Next, as shown in FIG. 13, conductive resin 10 which has been applied to the top of ink chamber partition 29 is selectively removed by a chopping process using a blade (abrasive) of a dicing or slicing machine.

"Chopping" refers to a treatment performed by lifting and lowering a blade that is rotated at a high speed. The shape of the arc portion along the periphery of the blade is transferred to the chopped portion.

During the chopping, conductive resin 10 is first removed in the direction perpendicular to the line in which conductive resin 10 was applied to ink chamber partitions 29 by the dispenser (i.e. in the direction in which ink chambers 26 extend). Subsequently, a portion of ink chamber partition 29 corresponding to the width of the blade is cut by a depth of 10–20 µm. Chopping is then repeated with a predetermined pitch feed for selectively grinding the region of conductive resin 10. This removes conductive resin 10. This allows ink chambers 26 to be electrically separated.

The desirable widths of the blade are such that one chopping can remove conductive resin 10 which is located atop each ink chamber partition 29. Consequently, it is more efficient to have a largest possible machining surface of the blade.

The shape of the outer diameter of the blade is transferred to the removed region. Accordingly, the method of the present embodiment uses a blade having a chopping surface with a width of 2.5 mm and a diameter of 2 inches.

The chopping rate is 5 mm/s. During chopping, the blade is lowered in the direction perpendicular to the main surface of piezoelectric substrate 60 to cut each ink chamber partition 29 with a depth of 10–20 µm. Therefore, the chopping process will not particularly increase the duration of the process.

The portion of ink chamber partition 29 where conductive resin 10 is removed by the blade has a height that is smaller than that of the other portion of ink chamber partition 29 by about 10–20 µm. Consequently, the grinded portion due to the chopping does not contribute to adhesion with cover 61. The surface roughness of the grinded portion, therefore, does not need to be taken into consideration. As a result, the blade can be selected solely based on its ability in machining during the removal of conductive resin 10.

In the method of the present embodiment, a diamond blade of No. 600 is used for grinding. This can achieve a satisfactory grinding without conductive resin 10 clogging the blade.

In the method of the present embodiment, not the entire top face of each ink chamber partition 29 over piezoelectric substrate 60 is grinded. Instead, only the portion of conductive resin 10 applied to the top of ink chamber 29 is selectively polished or grinded to be made flat. Consequently, it is not necessary to level warping of piezoelectric substrate 60 as in the case when the entire top face of each ink chamber partition 29 over piezoelectric substrate 60 is polished or grinded. Moreover, in the method of the present embodiment, piezoelectric substrate 60 may be fixed to the dicing stage by vacuum absorption as in a usual dicing without any disadvantages.

In the method of the present embodiment, grinding is performed in the direction perpendicular to the conductive resin 10 (the direction in which ink chambers 26 extend). Accordingly, no stress is applied in the direction that would cause a conductive resin 10 applied to each ink chamber 26 and ink chamber partition 29 adhered thereto to be pulled apart. As a result, a more reliable continuity can be provided between conductive resin 10 and actuator driving electrodes 27 and 28.

A description of the blades and the grinding depths is provided below.

The blade used in the above experiments is of 2–3 inches in diameter, and the width W (in the direction in which ink chamber partitions 29 extend) of applied conductive resin 10 ranges from 1.0 to 1.5 mm. Further, at least conductive resin 10 which has been applied to the top of each ink chamber partition 29 needs to be grinded away. Accordingly, taking the flatness of the piezoelectric substrate (±0.005 mm) into account, the maximum of the grinding depth by the blade may be 20–30 µm.

A comparison among the methods of the above first to third embodiments is provided below with reference to Table 1.

As shown in FIG. 9, when the entire top surface of each protrusion over the piezoelectric substrate is polished, the disk is positioned with respect to the piezoelectric substrate such that the direction of the polishing by the rotated disk is generally parallel to the direction in which the top surface of each ink chamber partition extends. As a result, although an ink jet head according to the manufacturing method of the present embodiment has inferior ejection performances, practically no delamination between the ink chamber partition and the conductive resin occurs.

Figure 12:
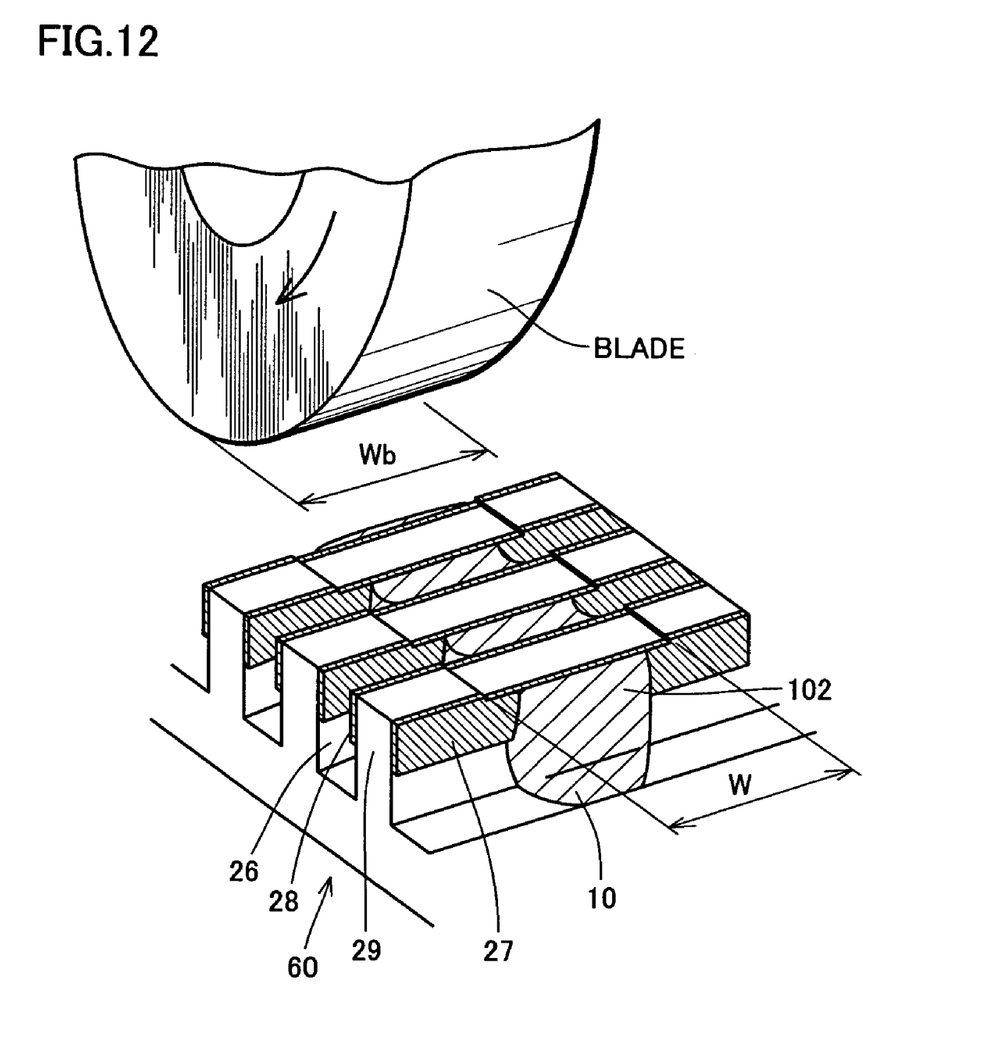
FIG. 12 is a perspective view of an ink jet illustrating a method of manufacturing an ink jet head according to a second embodiment.

Referring to FIG. 12, the ejection performances are satisfactory when the grinding for removal of conductive resin is performed by a chopping in the direction perpendicular to the direction in which the top surface of each ink chamber partition extends. However, there is the possibility of ink chamber partition being pulled apart from the conductive resin.

Figure 13:
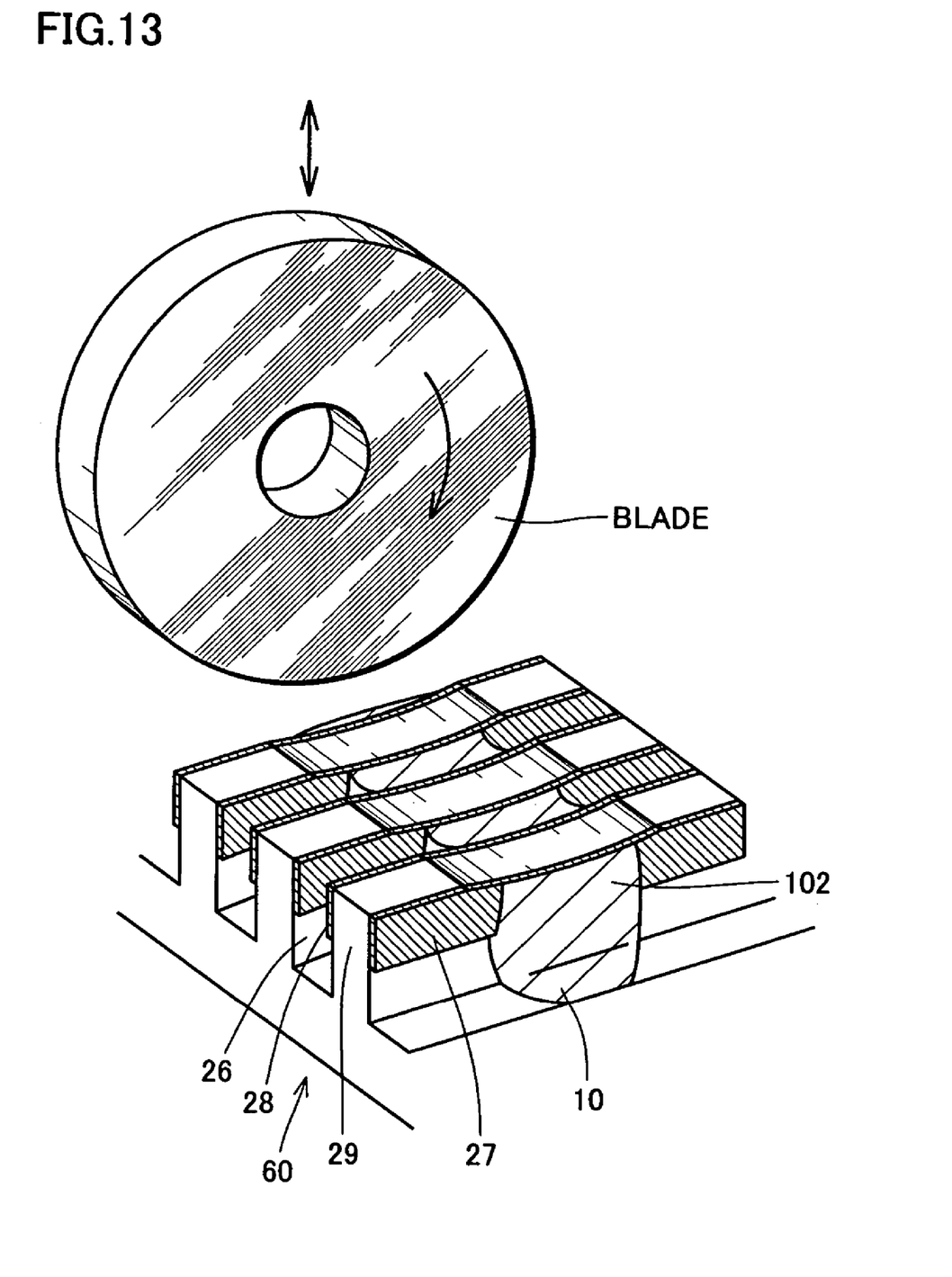
FIG. 13 is a perspective view of an ink jet head illustrating a method of manufacturing an ink jet head according to a third embodiment.

Referring to FIG. 13, when the grinding for removal of conductive resin is performed by a chopping in the direction parallel to the direction in which the top surface of each ink chamber partition extends, the ejection performances were satisfactory and practically no delamination between the ink chamber partition and the conductive resin occurred.

Consequently, it is desirable to perform the grinding for removal of conductive resin in the direction parallel to the direction in which the top surface of each ink chamber partition extends, as shown in FIG. 13.

TABLE 1

| (Comparative Examples) | Grinding Area | Ejection Performances etc. | Grinding Direction | Cracks | General Evaluation |
| --- | --- | --- | --- | --- | --- |
| The method of FIG. 9 | Entire surface | X | Parallel | ○ | Δ |
| The method of FIG. 12 | Partial | ○ | Perpendicular | X | Δ |
| The method of FIG. 13 | Partial | ○ | Parallel | ○ | ◎ |

It should be understood that the disclosed embodiments above are, in all respects, by way of illustration and example only and are not by way of limitation. The scope of the present invention is set forth by the claims rather than the above description and is intended to include all the modifications within the spirit and scope equivalent to those of the claims.

INDUSTRIAL APPLICABILITY

The present invention, as described above, provides an ink jet head with a reduced power consumption, with an improved productivity and reliability and that allows a high-speed printing.

The invention claimed is:

1. A method of manufacturing an ink jet head, comprising the steps of:
    forming an ink chamber extending on a surface of a piezoelectric substrate from one end to the other end;
    forming a driving electrode within said ink chamber; and
    forming an electrode for external connection connected to said driving electrode and connected to an external electrode provided externally,
    wherein said step of forming the electrode for external connection includes the steps of:
        applying a conductive material to one end of said ink chamber within said ink chamber and to a top surface of a protruding wall defining said ink chamber; and
        removing that conductive material which has been applied to the top surface of each protusion over said piezoelectric substrate,
    wherein, when a plurality of ink chambers are provided extending parallel to each other, said step of applying conductive material includes applying said conductive resin linearly traversing said plurality of ink chambers perpendicularly.

2. The method of manufacturing an ink jet head according to claim 1, wherein said step of removing conductive material includes removing that conductive material which has been applied to said top surface by polishing or grinding.

3. The method of manufacturing an ink jet head according to claim 2, wherein said polishing or grinding includes polishing or grinding the entire area of said top surface.

4. The method of manufacturing an ink jet head according to claim 2, wherein said polishing or grinding includes selectively polishing or grinding a portion of said top surface where said conductive material is provided.

5. The method of manufacturing an ink jet head according to claim 4, wherein said selective polishing or grinding is performed in a direction parallel to the direction in which said ink chamber extends.

6. The method of manufacturing an ink jet head according to claim 4, wherein said selective polishing or grinding is performed in a direction perpendicular to the direction in which said ink chamber extends.

7. The method of manufacturing an ink jet head according to claim 1, wherein said step of removing conductive material includes removing said conductive material by grinding using a dicing or slicing machine.

8. The method of manufacturing an ink jet head according to claim 7, wherein said grinding using the dicing or slicing machine includes chopping.

* * * * *